US012592692B2

(12) United States Patent
Chen et al.

(10) Patent No.: US 12,592,692 B2
(45) Date of Patent: Mar. 31, 2026

(54) POWER DEVICE

(71) Applicant: CHIP-GAN POWER SEMICONDUCTOR CORPORATION, Hsinchu City (TW)

(72) Inventors: Ke-Horng Chen, Hsinchu City (TW); Kuo-Lin Zheng, Hsinchu City (TW); Yu-Chou Ko, Hsinchu City (TW); Ke-Ming Su, Hsinchu City (TW); Ying-Feng Wu, Hsinchu City (TW); Chun-Chieh Kuo, Hsinchu City (TW); Shang-Chiang Chin, Hsinchu City (TW)

(73) Assignee: Chip-GaN Power Semiconductor Corporation, Hsinchu City (TW)

( * ) Notice: Subject to any disclaimer, the term of this patent is extended or adjusted under 35 U.S.C. 154(b) by 1 day.

(21) Appl. No.: 18/743,466

(22) Filed: Jun. 14, 2024

(65) Prior Publication Data

US 2025/0309889 A1     Oct. 2, 2025

(30) Foreign Application Priority Data

Mar. 27, 2024    (TW) ................................. 113111333

(51) Int. Cl.
| | |
|---|---|
| *H03K 17/10* | (2006.01) |
| *H02M 1/00* | (2007.01) |
| *H02M 3/158* | (2006.01) |

(52) U.S. Cl.
CPC ........ *H03K 17/102* (2013.01); *H02M 1/0006* (2021.05); *H02M 3/158* (2013.01); *H03K 2217/0036* (2013.01)

(58) Field of Classification Search
CPC ........ H03K 17/102; H03K 2217/0036; H02M 1/0006; H02M 3/158
See application file for complete search history.

(56) References Cited

U.S. PATENT DOCUMENTS

2025/0157431 A1*    5/2025    Kimura ................ G09G 3/3677

FOREIGN PATENT DOCUMENTS

CN              116155070 A  *  5/2023  .............. H02M 1/08

* cited by examiner

*Primary Examiner* — Metasebia T Retebo
(74) *Attorney, Agent, or Firm* — Rosenberg, Klein & Lee

(57) ABSTRACT
A power device includes a power switch circuit, a driver, a regulator, at least one power obtaining circuit, a first pin, a second pin and a third pin. The driver controls the power switch circuit to connect the first pin to the second pin or disconnect the first pin from the second pin according to signals on the third pin. The at least one power obtaining circuit obtains voltages from the first pin, the third pin, and/or the power switch circuit. The regulator converts the voltages provided by the at least one power obtaining circuit into a suitable voltage and provides the suitable voltage for the power terminal of the driver. Since the power required for the driver can be obtained from inside the power device, there is no need to add an additional pin to obtain power from outside the power device.

15 Claims, 12 Drawing Sheets

POWER DEVICE

BACKGROUND OF THE INVENTION

This application claims priority for the TW Applications No. 113111333, filed on 27 Mar. 2024, the content of which is incorporated by reference in its entirely.

FIELD OF THE INVENTION

The present disclosure relates to a power device, particularly to a power device with only three pins using GaN transistors.

DESCRIPTION OF THE RELATED ART

Conventional power devices are composed of metal oxide semiconductor field effect transistors (MOSFETs). With the advancement of technology, electronic devices are driven by higher and higher voltage and operate at higher and higher frequencies. Therefore, traditional power devices composed of MOSFETs are not able to meet the requirement. In order to increase response speed, reduce volume and improve efficiency, a power device using gallium nitride (GaN) transistors has been proposed.

FIG. 1 shows a current power device 100 adopting GaN transistors, which includes a regulator 102, a driver 104, a power switch circuit 106, and four pins 108~114. The regulator 102 obtains a voltage Vp1 from outside the power device 100 through the pin 108, then converts the voltage Vp1 into a voltage Vp2, and provides the voltage Vp2 for one of the two power terminals of the driver 104. Another power terminal of the driver 104 obtains a voltage VL through the pin 114. The voltage VL is usually 0V. The power switch circuit 106 includes at least one GaN transistor (not shown) and the at least one GaN transistor is coupled between the pin 112 and the pin 114. The driver 104 controls the power switch circuit 106 to electrically connect the pin 112 to the pin 114 or form an open circuit between the pin 112 and the pin 114 according to an input signal Vin on the pin 110. Specifically, when the input signal Vin is at a first level (e.g., a high level), the driver 104 turns on the power switch circuit 106 to electrically connect the pin 112 to the pin 114. When the input signal Vin is at the second level (e.g., a low level), the driver 104 turns off the power switch circuit 106 to form an open circuit between the pin 112 and the pin 114.

Compared with MOSFET, GaN transistor can withstand high voltage and can provide higher operating frequency. However, the GaN transistor requires a driver 104 to drive, and the driver 104 requires an additional power voltage (i.e., voltage V2) to operate. Therefore, compared with a power device implemented with MOSFETs, the power device 100 needs to add a pin 108 to obtain the power voltage required for the driver 104. In other words, the current power device 100 using GaN transistors requires at least four pins 108~114, which is disadvantageous to directly replacing power devices using MOSFETs with power devices using GaN transistors in power electronics topology structures.

SUMMARY OF THE INVENTION

One of objectives of the present disclosure is to provide a power device that uses GaN transistors and has only three pins.

According to the present disclosure, a power device includes a first pin, a second pin, a third pin for receiving a signal, a power switch circuit, a driver, a first power obtaining circuit, and a regulator. The power switch circuit is connected with and between the first pin and the second pin or form an open circuit between the first pin and the second pin. The driver is configured to control the power switch circuit to form an electrical connection or an open circuit between the first pin and the second pin according to the signal from the third pin. The first power obtaining circuit is configured to obtain a first voltage from the first pin to generate a second voltage. The regulator is configured to convert the second voltage into a third voltage and provide the third voltage for the driver.

According to the present disclosure, a power device includes a first pin, a second pin, a third pin for receiving a signal, a power switch circuit, a driver, a first power obtaining circuit, and a regulator. The power switch circuit is connected with and between the first pin and the second pin. The driver is configured to control the power switch circuit to form an electrical connection or an open circuit between the first pin and the second pin according to the signal from the third pin. The first power obtaining circuit is configured to obtain a first voltage from the third pin to generate a second voltage. The regulator is configured to convert the second voltage into a third voltage and provide the third voltage for the driver.

According to the present disclosure, a power device includes a first pin, a second pin, a third pin for receiving a signal, a power switch circuit, a driver, a first power obtaining circuit, and a regulator. The power switch circuit is connected with and between the first pin and the second pin. The driver is configured to control the power switch circuit to form an electrical connection or an open circuit between the first pin and the second pin according to the signal from the third pin. The first power obtaining circuit is configured to obtain a first voltage from the first pin to generate a second voltage. The regulator is configured to convert the second voltage into a third voltage and provide the third voltage for the driver.

The power required for the driver in the power device of the present disclosure can be obtained from inside the power device. As a result, there is no need to add additional pins to obtain power from outside the power device. Compared with the present power device that requires four pins, the power device of the present disclosure can save costs. Furthermore, the power device of the present disclosure can directly replace the power device using MOSFET in the electronic device without modifying the power electronic topology structure of the electronic device.

Below, the embodiments are described in detail in cooperation with the drawings to make easily understood the technical contents, characteristics and accomplishments of the present disclosure.

DETAILED DESCRIPTION OF THE INVENTION

Figure 1:
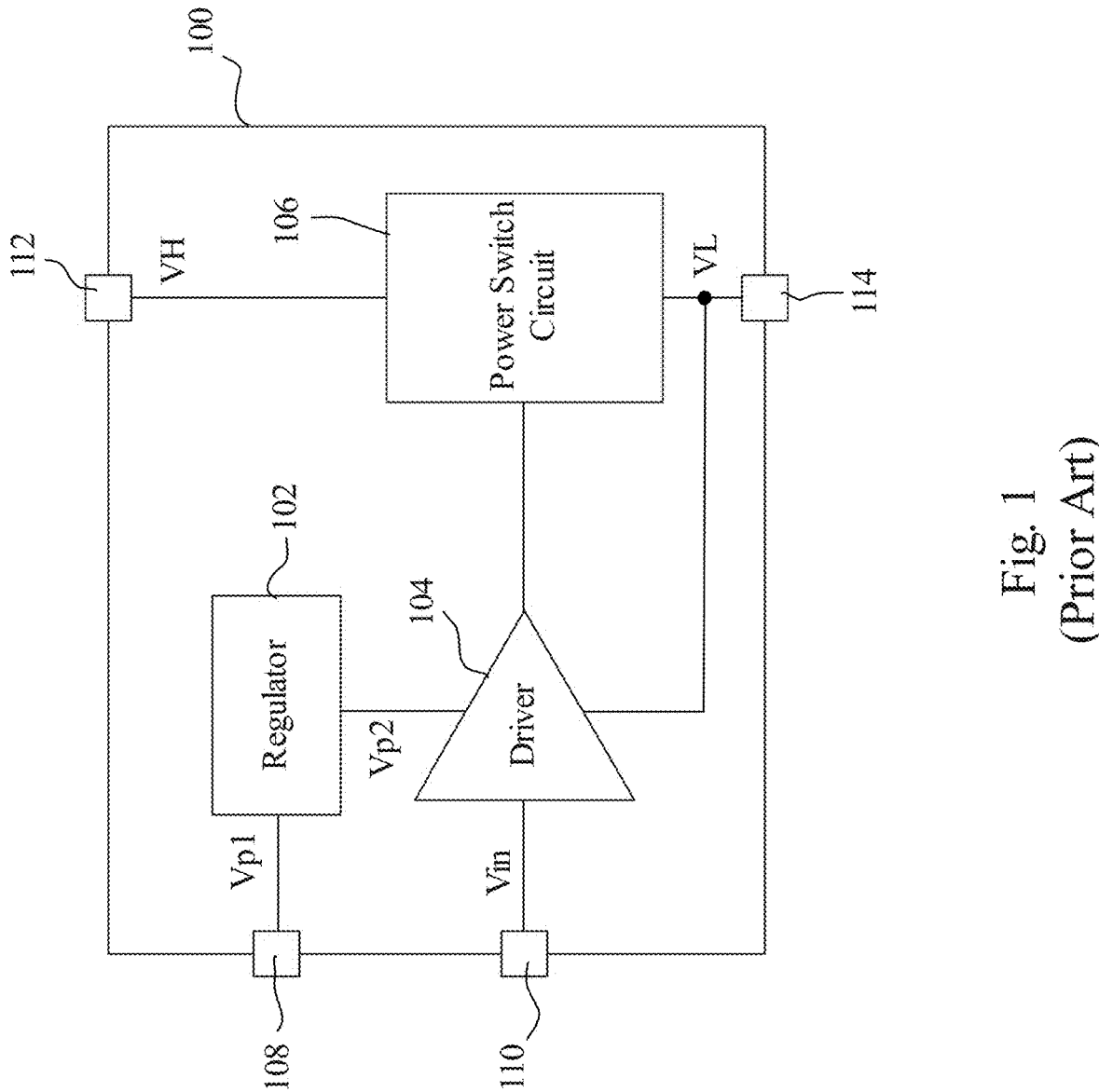
FIG. 1 shows a conventional power device using GaN transistors.
Figure 2:
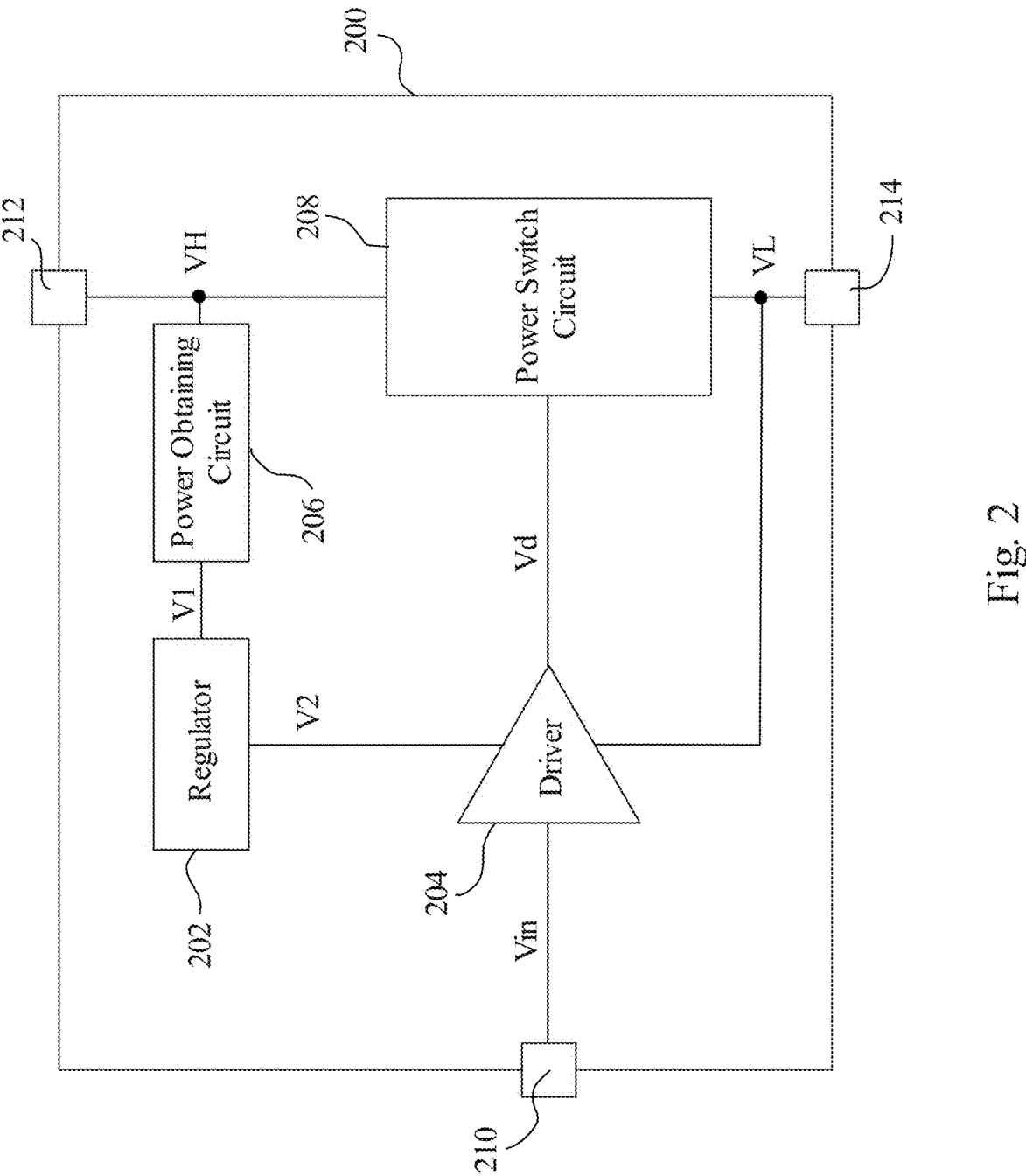
FIG. 2 shows a power device according to a first embodiment of the present disclosure.

FIG. 2 shows a power device according to a first embodiment of the present disclosure. In FIG. 2, a power device 200 includes a regulator 202, a driver 204, a power obtaining circuit 206, a power switch circuit 208, and three pins 210~214. The power switch circuit 208 is coupled between the pins 212 and 214 and configured to connect the pin 212 to the pin 214 or disconnect the pin 212 from the pin 214. The power obtaining circuit 206 is coupled to the pin 212 and the regulator 202. The power obtaining circuit 206 obtains a voltage VH from the pin 212 to generate a voltage V1. The regulator 202 is coupled between the power circuit 206 and the driver 204. The regulator 202 is configured to convert the voltage V1 from the power obtaining circuit 206 into a voltage V2 and provide the voltage V2 for one of the two power terminals of the driver 204. Another power terminal of the driver 204 obtains a voltage VL through the pin 214. The voltage VL may be, but not limited to, 0V. The driver 204 generates a driving signal Vd according to the input signal Vin on the pin 210 to control the power switch circuit 208 to connect the pin 212 to the pin 214 or disconnect the pin 212 from the pin 214. Specifically, when an input signal Vin is at a first level (e.g., a high level), the driver 204 turns on the power switch circuit 208 to form an electrical connection between the pin 212 and the pin 214. When the input signal Vin is at a second level (e.g., low level), the driver 204 turns off the power switch circuit 208 to form an open circuit between the pin 212 and the pin 214, wherein the open circuit means that an electrical current is unable to flow between the pin 212 and the pin 214.

Figure 3:
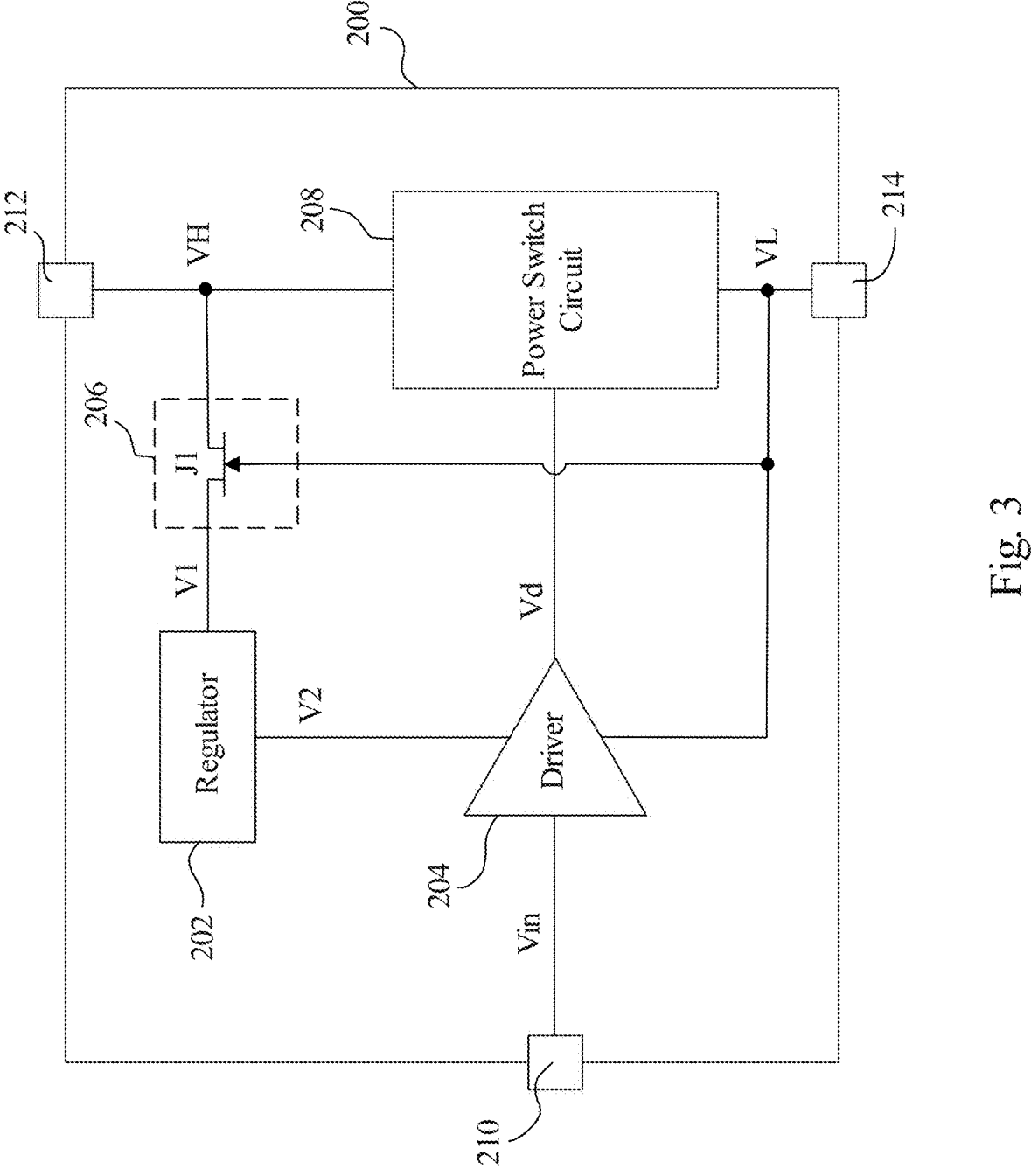
FIG. 3 shows a power obtaining circuit of FIG. 2 according to an embodiment of the present disclosure.

FIG. 3 shows a circuit architecture of the power obtaining circuit 206 of FIG. 2 according to an embodiment of the present disclosure. In FIG. 3, the power obtaining circuit 206 includes a junction gate field-effect transistor (JFET) J1. The JFET J1 has an input, an output, and a control terminal, wherein the input is coupled to the pin 212, the output is coupled to the regulator 202, and the control terminal is coupled to pin 214. In other embodiments, the control terminal of JFET J1 can also be coupled to a predetermined voltage source. In FIG. 3, the power obtaining circuit 206 is composed of JFET J1, but the present disclosure is not limited thereto. Other components (such as diodes or MOSFETs) can also be used as the power obtaining circuit 206. When the voltage VH of the pin 212 is a high voltage, the component coupled to the pin 212 in the power obtaining circuit 206 must be a high-voltage withstanding component to prevent from lest the power switch circuit 208 being burnt out.

Figure 6:
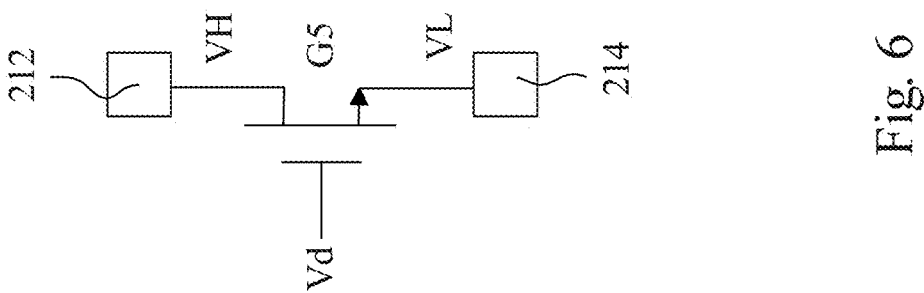
FIG. 6 shows a power switch circuit of FIG. 2 according to a third embodiment of the present disclosure.
Figure 5:
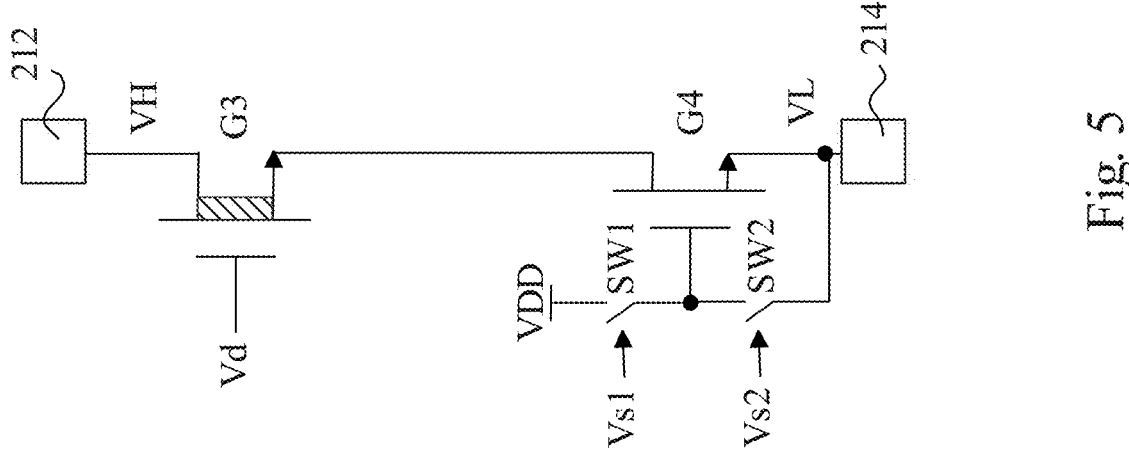
FIG. 5 shows a power switch circuit of FIG. 2 according to a second embodiment of the present disclosure.
Figure 4:
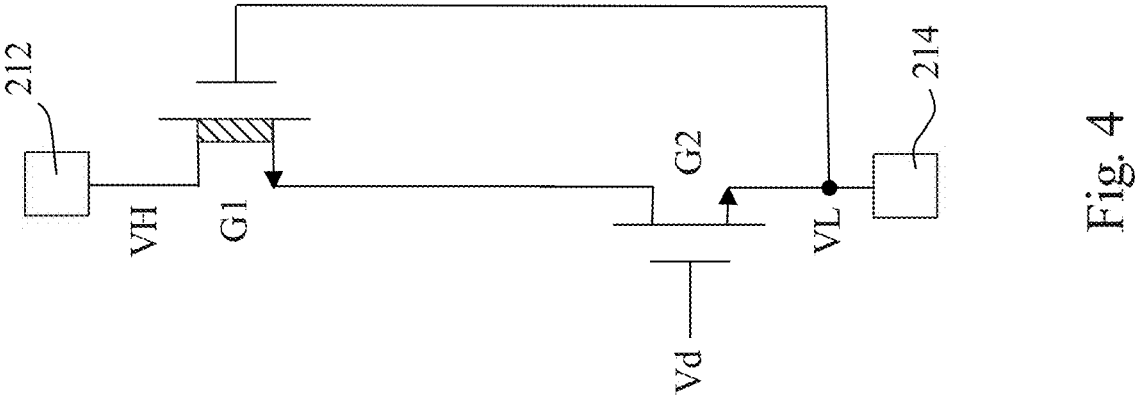
FIG. 4 shows a power switch circuit of FIG. 2 according to a first embodiment of the present disclosure.

FIG. 4, FIG. 5, and FIG. 6 respectively show three embodiments of the power switch circuit 208, but the power switch circuit 208 of the present disclosure is not limited to these. FIG. 4 shows the power switch circuit 208 of FIG. 2 according to a first embodiment of the present disclosure, which includes a depletion-mode GaN transistor G1 and an enhancement-mode GaN transistor G2 as switching components. The depletion-mode GaN transistor G1 has a first input (i.e., a drain), a first output (i.e., a source), and a first control terminal (i.e., a gate), wherein the first input is coupled to the pin 212, the first output is coupled to the enhancement-mode GaN transistor G2, and the first control terminal is coupled to the pin 214. The enhancement-mode GaN transistor G2 has a second input (i.e., a drain), a second output (i.e., a source) and a second control terminal (i.e., a gate), wherein the second input is coupled to the first output, the second output is coupled to the pin 214, and the second control terminal is coupled to the driver 204. In other embodiments, the enhancement-mode GaN transistor G2 of FIG. 4 can also be replaced by a MOSFET.

FIG. 5 shows a power switch circuit 208 shown in FIG. 2 according to a second embodiment of the present disclosure, which includes a depletion-mode GaN transistor G3 and an enhancement-mode GaN transistor G4 as switching components. The depletion-mode GaN transistor G3 has a first input (i.e., a drain), a first output (i.e., a source), and a first control terminal (i.e., a gate), wherein the first input is coupled to the pin 212, and the first output is coupled to the enhancement-mode GaN transistor G4, and the first control terminal is coupled to the driver 204. The enhancement-mode GaN transistor G4 has a second input (i.e., a drain), a second output (i.e., a source) and a second control terminal (i.e., a gate), wherein the second input is coupled to the first output, The second output is coupled to the pin 214, and the second control terminal is coupled to a power supply voltage VDD through a switch SW1. The switch SW1 can be controlled by a signal Vs1. The second control terminal is coupled to the pin 214 through a switch SW2. The switch SW2 can be controlled by a signal Vs2. When the driver 204 is started, the driving signal Vd cannot immediately reach a predetermined voltage value for turning off the depletion-mode GaN transistor G3. Therefore, in order to prevent the depletion-mode GaN transistor G3 and the enhancement-mode GaN transistor G4 from being turned on at the same time and damaging circuit, the switch SW1 will be turned off and the switch SW2 will be turned on to turn off the enhancement-mode GaN transistor G4 when the driver 204 is started. After the driver 204 is started (that is to say, the driving signal Vd reaches the predetermined voltage value), the switch SW1 will be turned on and the switch SW2 will be turned off to maintain the enhancement-mode GaN transistor G4 in the on state. In other embodiments, the switch SW2 of FIG. 5 can also be coupled between the second control terminal and a ground terminal. In other embodiments, the enhancement-mode GaN transistor G4 of FIG. 5 can also be replaced by a MOSFET.

FIG. 6 shows a power switch circuit 208 of FIG. 2 according to a third embodiment of the present disclosure, which includes an enhancement-mode GaN transistor G5 as a switching component. The enhancement mode GaN transistor G5 has an input (i.e., a drain), an output (i.e., a source), and a control terminal (i.e., a gate), wherein the input is coupled to the pin 212, the output is coupled to the pin 214, and the control terminal is coupled to the driver 204 for receiving the driving signal Vd.

Figure 7:
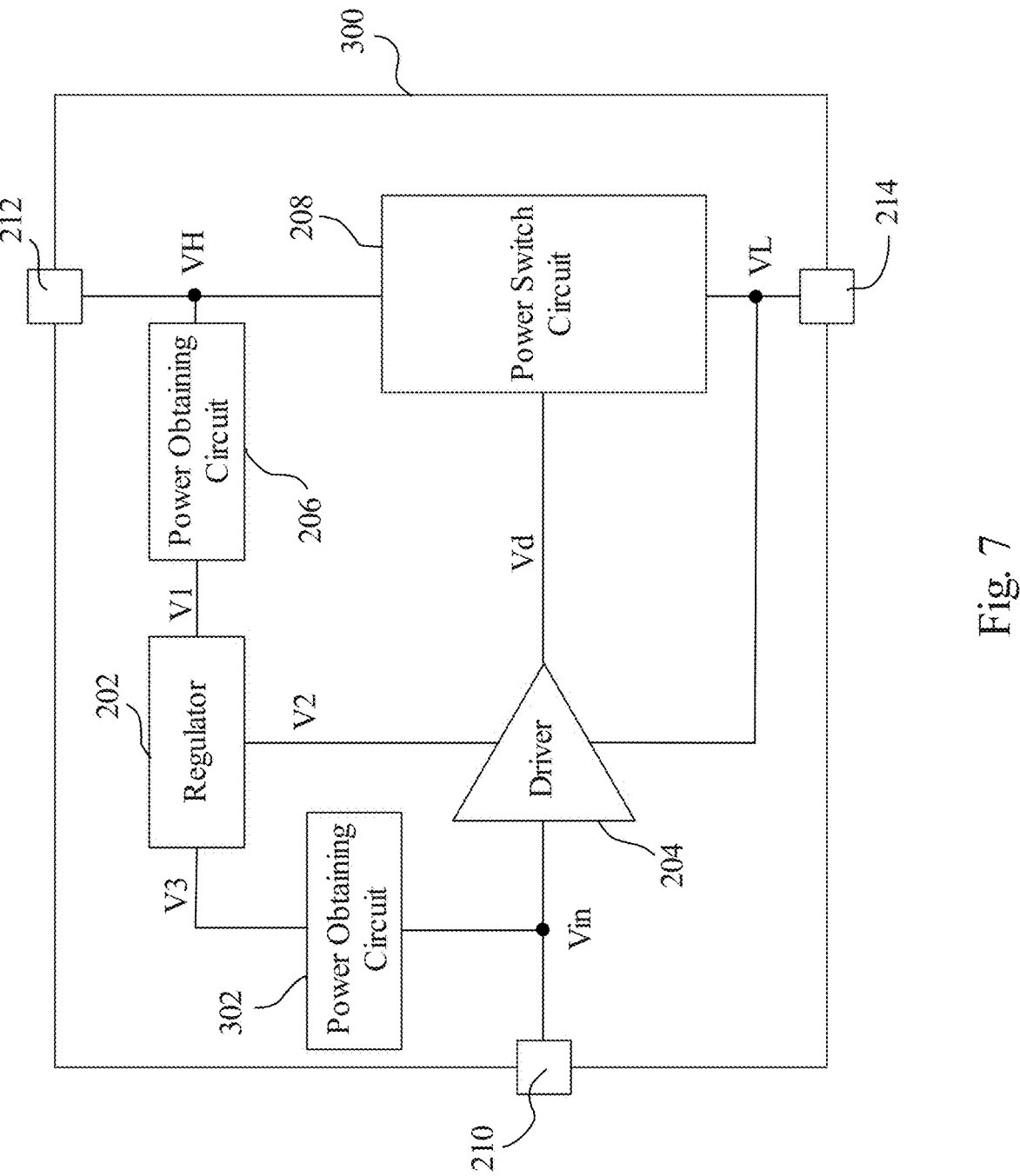
FIG. 7 shows a power device according to a second embodiment of the present disclosure.

FIG. 7 shows a power device according to a second embodiment of the present disclosure. The power device 300 of FIG. 7 also includes a regulator 202, a driver 204, a power obtaining circuit 206, a power switch circuit 208, and three pins 210~214. The power device 300 shown in FIG. 7 is different from the power device 200 shown in FIG. 2 in that the power device 300 further includes a power obtaining circuit 302. The power circuit 302 is coupled to the regulator 202 and the pin 210. The power obtaining circuit 302 obtains a voltage (i.e., the input signal Vin) from the pin 210 to generate and transmit a voltage V3 to the regulator 202. The regulator 202 then converts the voltage V3 into the voltage V2.

Figure 8:
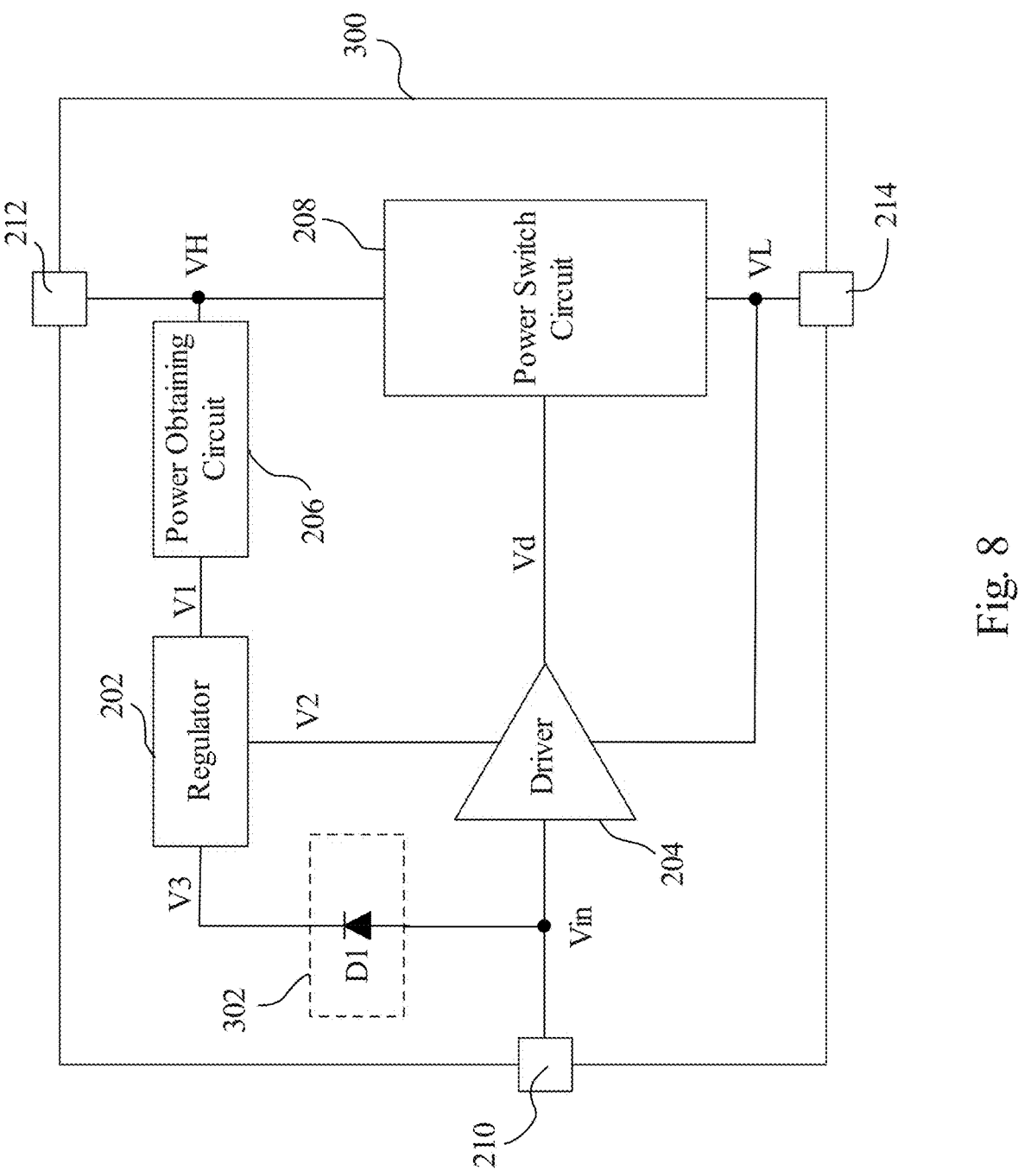
FIG. 8 shows a power obtaining circuit of FIG. 7 according to an embodiment of the present disclosure.

FIG. 8 shows a circuit architecture of the power obtaining circuit 302 of FIG. 7 according to an embodiment of the present disclosure. In FIG. 8, the power obtaining circuit 302 includes a diode D1. The diode D1 has an anode and a cathode, wherein the anode is coupled to the pin 210 and the cathode is coupled to the regulator 202. In other embodiments, diode D1 may be composed of a transistor. In the embodiment of FIG. 8, the power obtaining circuit 302 is composed of a diode D1, but the present disclosure is not limited thereto.

Figure 9:
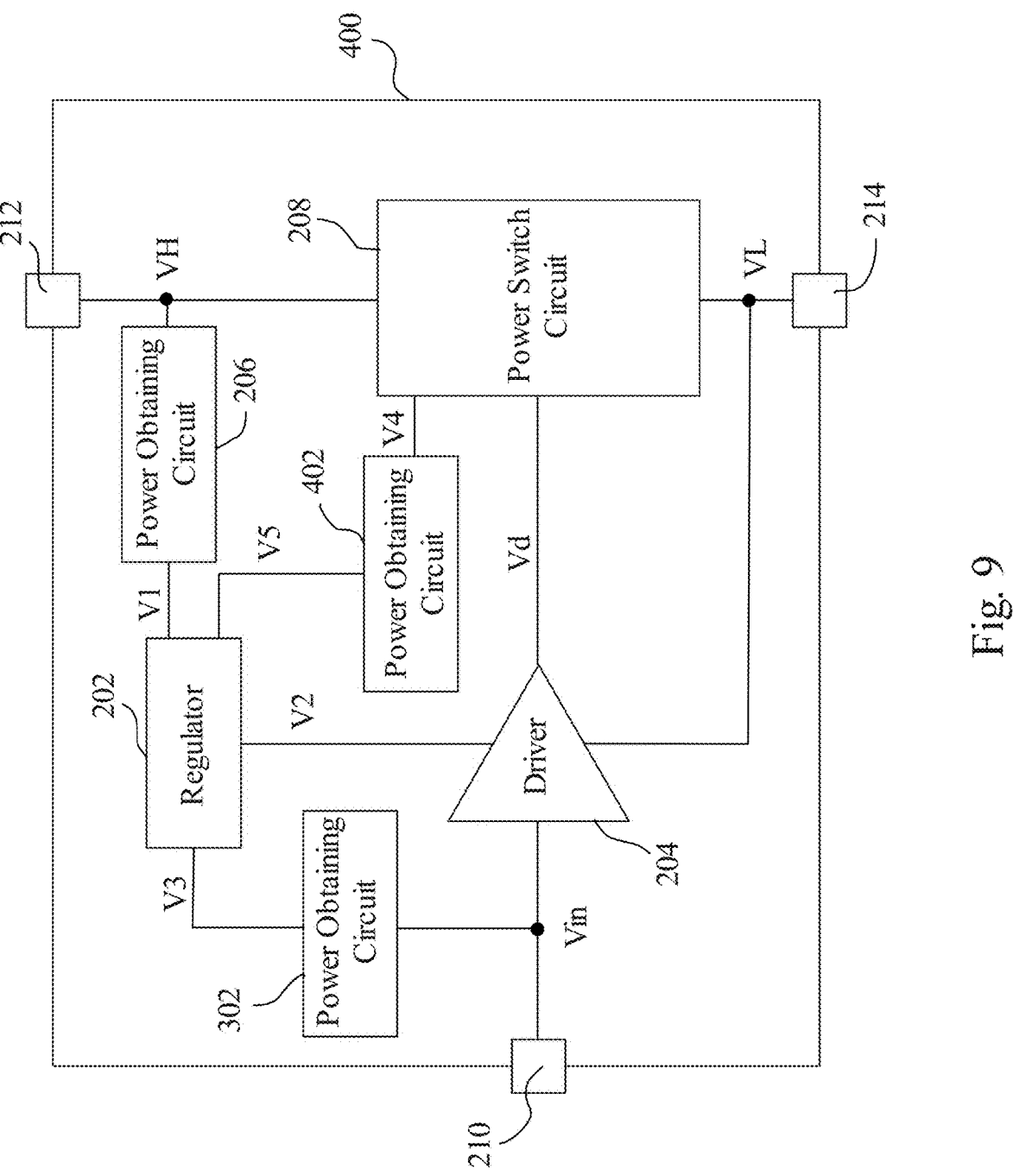
FIG. 9 shows a power device according to a third embodiment of the present disclosure.

FIG. 9 shows a power device 400 according to a third embodiment of the present disclosure. The power device 400 of FIG. 9 also include a regulator 202, a driver 204, a power obtaining circuit 206, a power switch circuit 208, three pins 210~214, and a power obtaining circuit 302. The power device 400 shown in FIG. 9 is different from the power device 300 shown in FIG. 7 in that the power device 400 further includes a power obtaining circuit 402. The power obtaining circuit 402 is coupled to the regulator 202 and the power switch circuit 208. The power obtaining circuit 402 obtains a voltage V4 from the power switch circuit 208 to generate and transmit a voltage V5 to the regulator 202.

Figure 10:
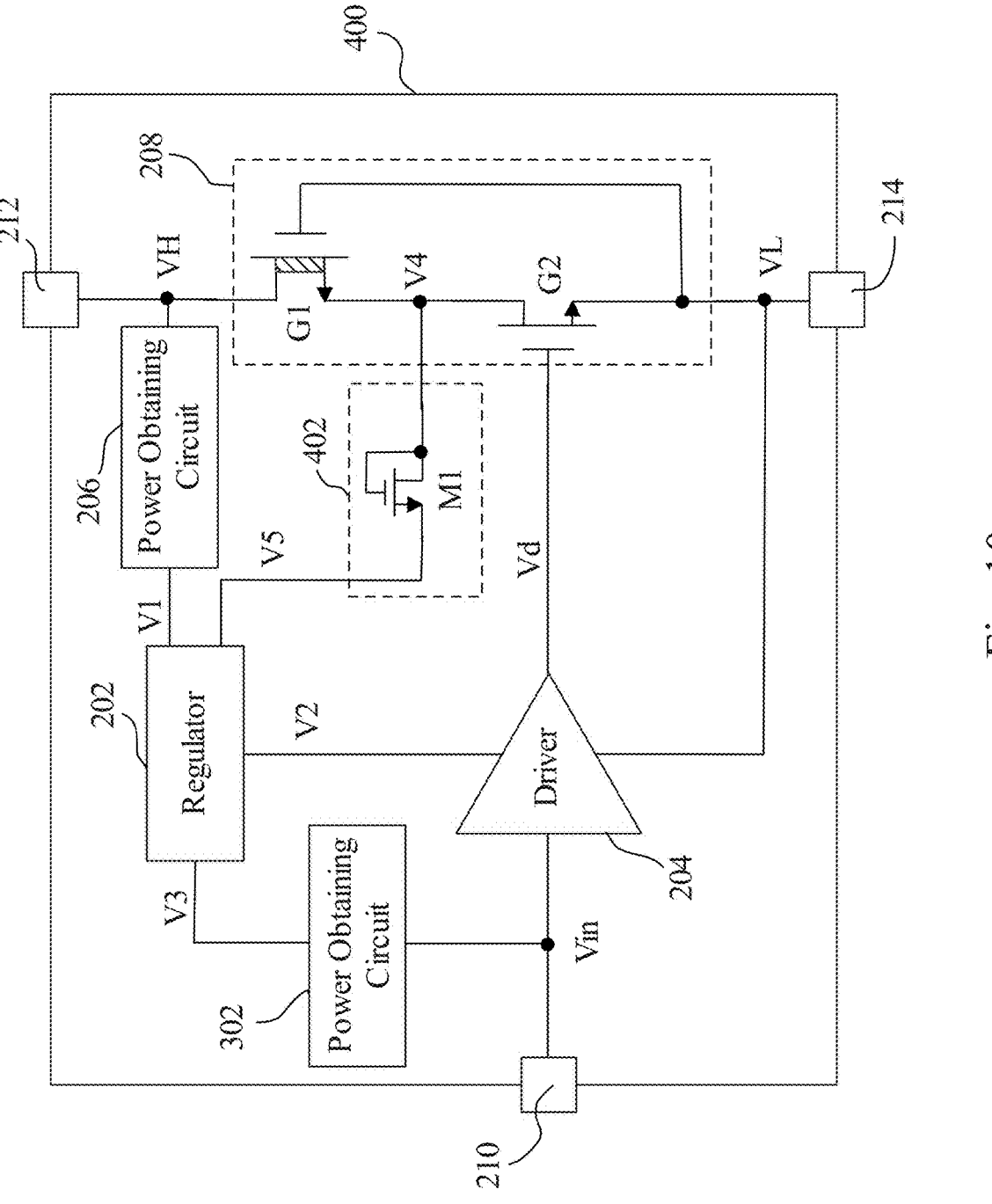
FIG. 10 shows a power obtaining circuit of FIG. 9 according to an embodiment of the present disclosure.

FIG. 10 shows a power obtaining circuit shown in FIG. 9 according to an embodiment of the present disclosure. In FIG. 10, the power switch circuit 208 is exemplified by the architecture shown in FIG. 4. The power obtaining circuit 402 shown in FIG. 10 includes a transistor M1. The transistor M1 forms a diode. The drain and the gate (i.e., an anode) of the transistor M1 are coupled to the first output (i.e., a source) of the depletion-mode GaN transistor G1 in the power switch circuit 208. The source (i.e., cathode) of the transistor M1 is coupled to the regulator 202. The transistor M1 obtains the voltage V4 from the first output of the depletion-mode GaN transistor G1 and generates and transmits the voltage V5 to the regulator 202. In the embodiment of FIG. 9, the power obtaining circuit 402 is composed of a transistor M1, but the present disclosure is not limited thereto.

Figure 11:
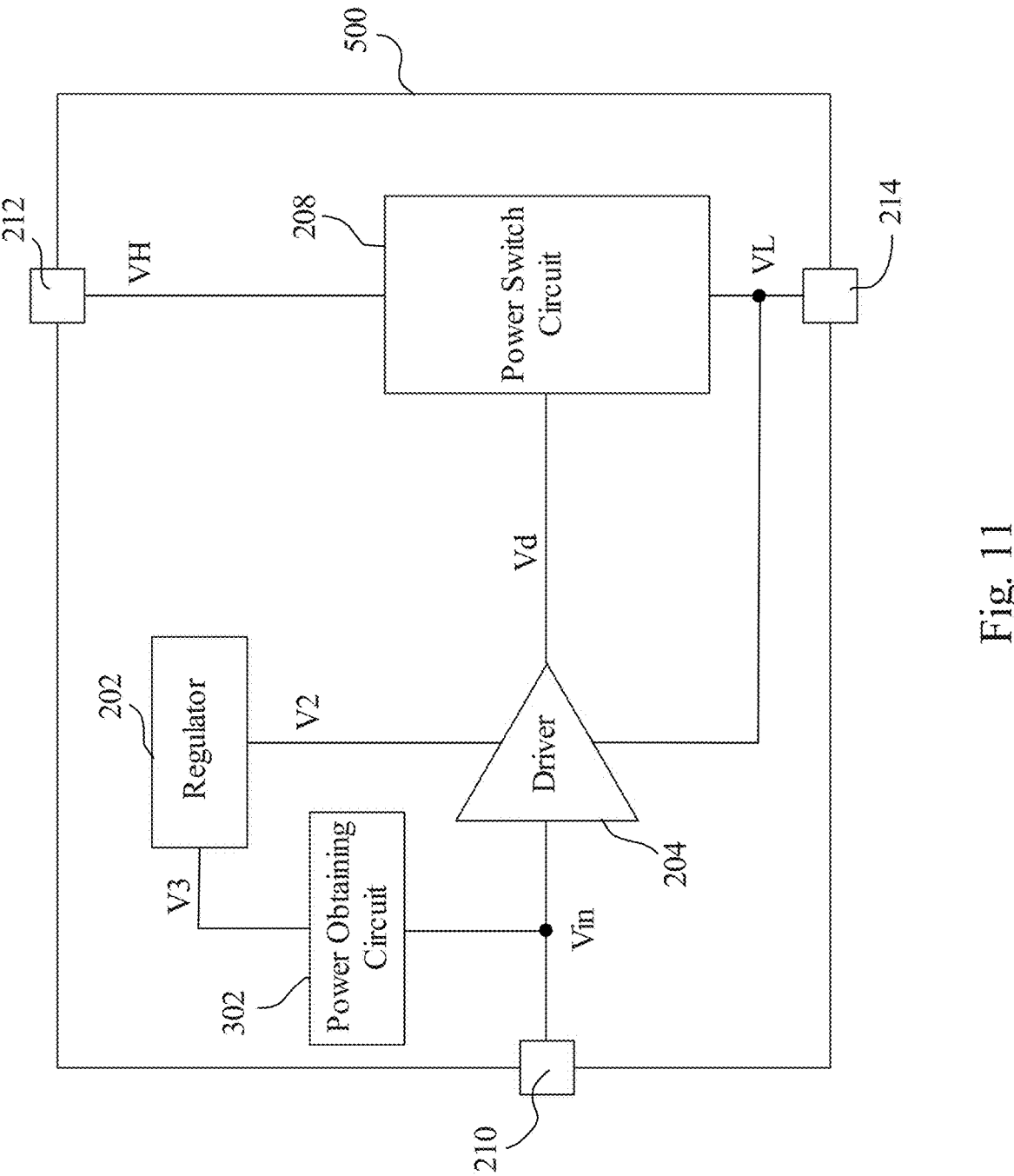
FIG. 11 shows a power device according to a fourth embodiment of the present disclosure.

FIG. 11 shows a power device according to a fourth embodiment of the present disclosure. The power device 500 shown in FIG. 11 also includes a regulator 202, a driver 204, a power switch circuit 208, three pins 210~214, and a power obtaining circuit 302. The power device 500 shown in FIG. 11 is different from the power device 300 shown in FIG. 7 in that the power device 500 omits the power obtaining circuit 206.

Figure 12:
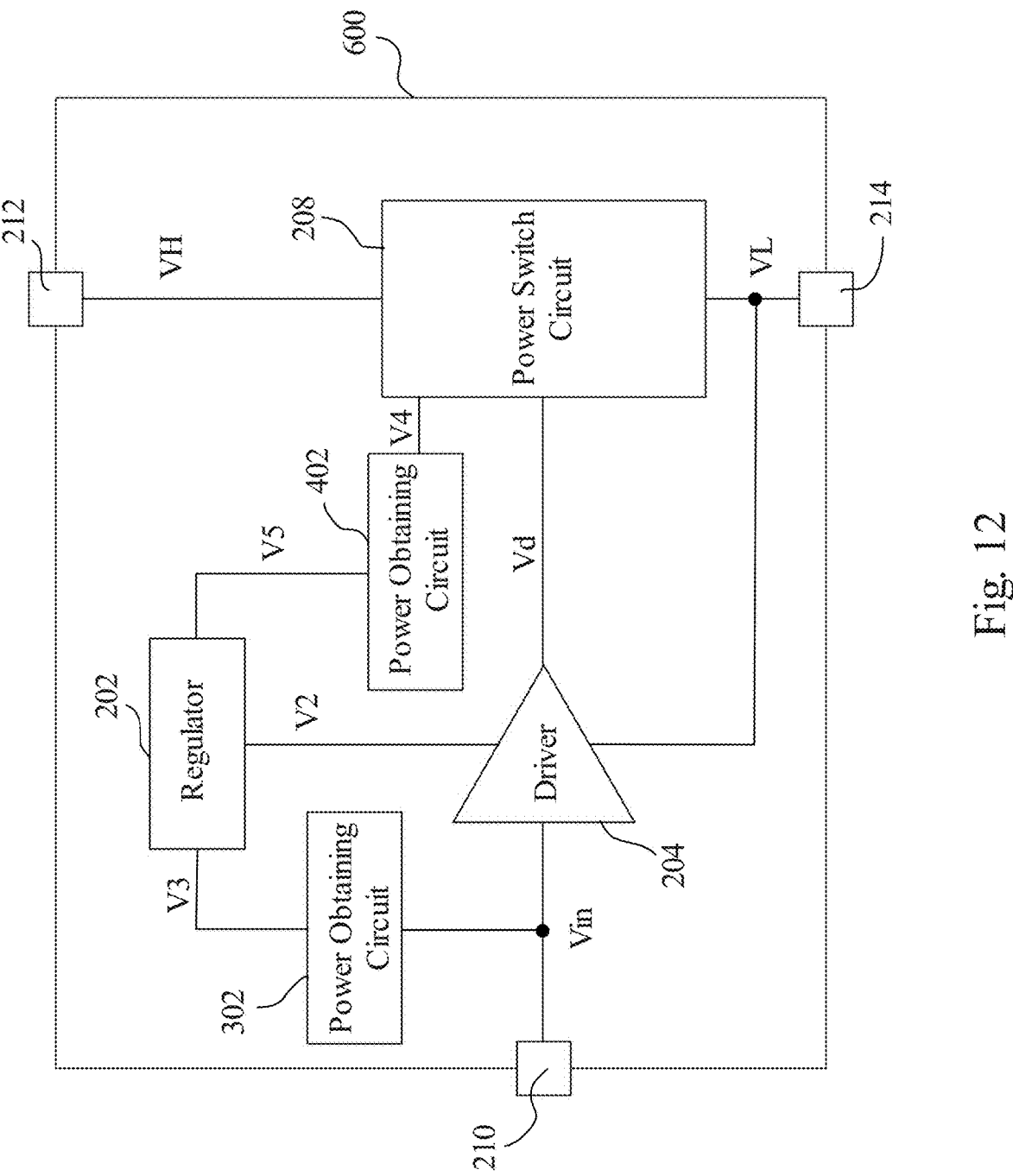
FIG. 12 shows a power device according to a fifth embodiment of the present disclosure.

FIG. 12 shows a power device according to a fifth embodiment of the present disclosure. The power device 600 shown in FIG. 12 also includes a regulator 202, a driver 204, a power switch circuit 208, three pins 210~214, and power obtaining circuits 302 and 402. The power device 600 shown in FIG. 12 is different from the power device 400 shown in FIG. 9 in that the power device 600 omits the power obtaining circuit 206.

Figure 13:
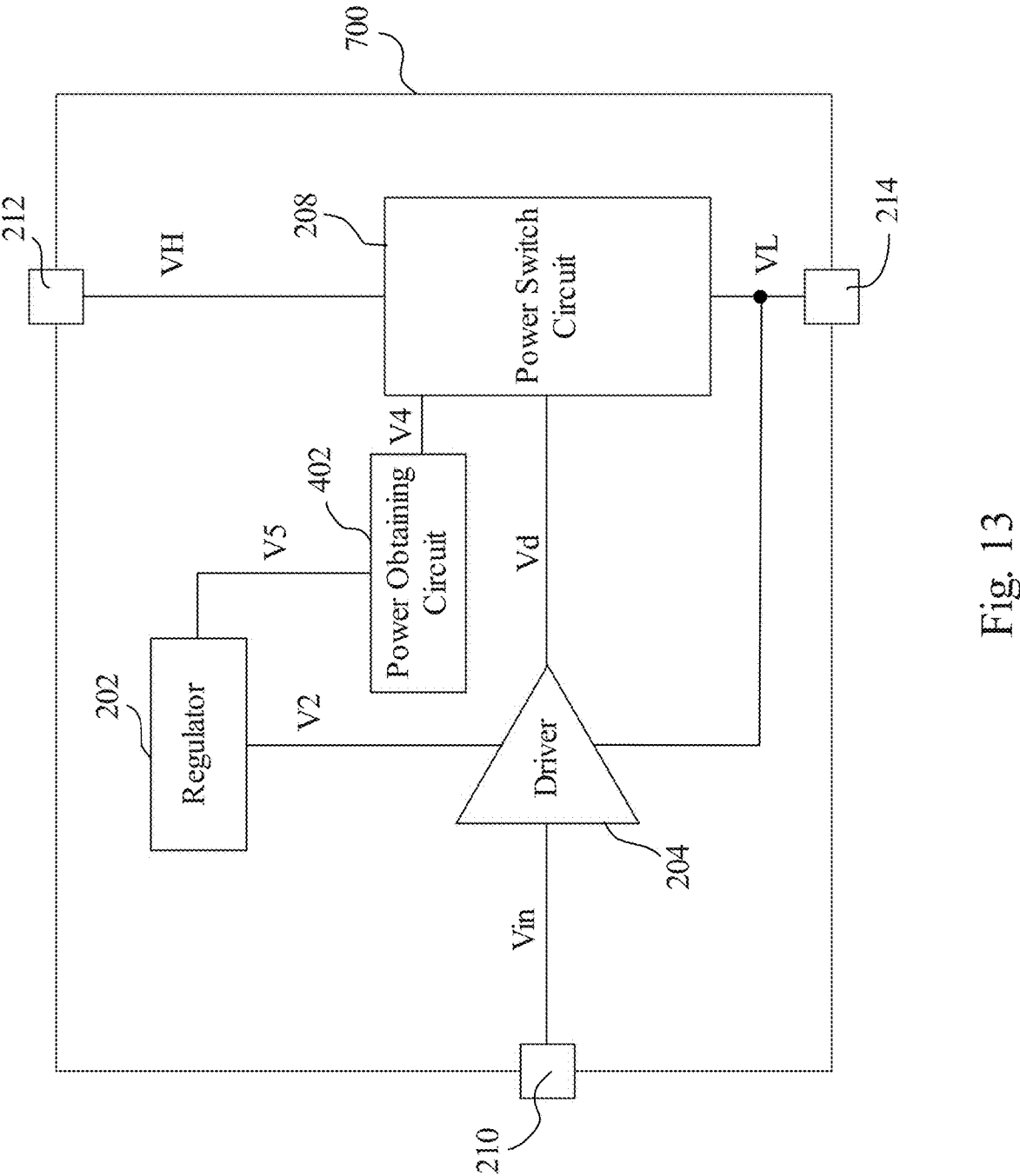
FIG. 13 shows a power device according to a sixth embodiment of the present disclosure.

FIG. 13 shows a power device according to a sixth embodiment of the present disclosure. The power device 700 shown in FIG. 13 also includes a regulator 202, a driver 204, a power switch circuit 208, three pins 210~214, and a power obtaining circuit 402. The power device 700 shown in FIG. 13 is different from the power device 600 shown in FIG. 12 in that the power device 700 omits the power obtaining circuit 302.

Figure 14:
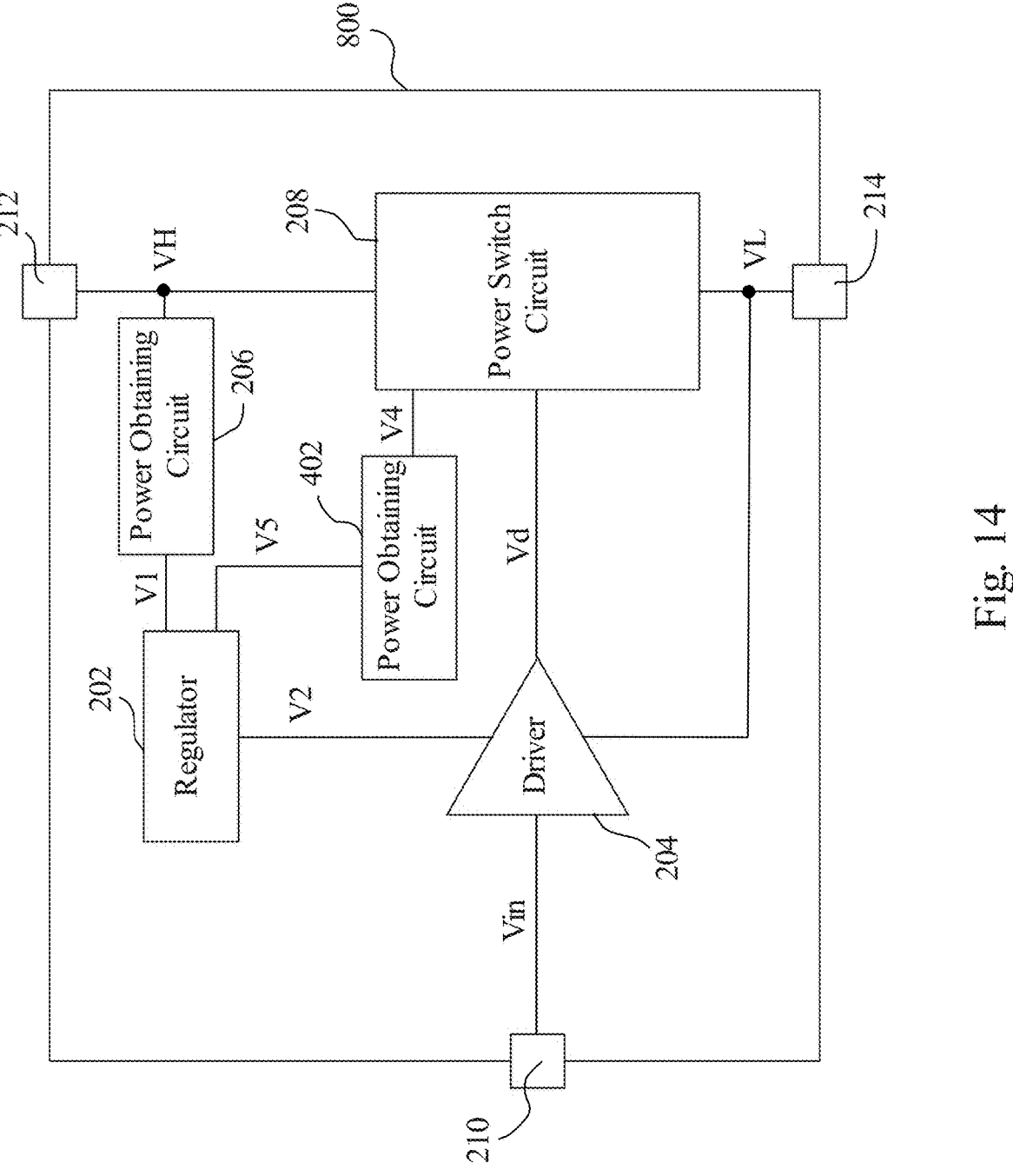
FIG. 14 shows a power device according to a seventh embodiment of the present disclosure.

FIG. 14 shows a power device according to a seventh embodiment of the present disclosure. The power device 800 shown in FIG. 14 also includes a regulator 202, a driver 204, a power obtaining circuit 206, a power switch circuit 208, three pins 210~214, and a power obtaining circuit 402. The power device 800 shown in FIG. 14 is different from the power device 400 shown in FIG. 9 in that the power device 800 omits the power obtaining circuit 302.

The embodiments described above are only to exemplify the present disclosure but not to limit the scope of the present disclosure. Therefore, any equivalent modification or variation according to the shapes, structures, features, or spirit disclosed by the present disclosure is to be also included within the scope of the present disclosure.

What is claimed is:

1. A power device comprising:
a first pin;
a second pin;
a third pin configured to receive a signal;
a power switch circuit coupled between the first pin and the second pin;
a driver coupled to the third pin and the power switch circuit and configured to control the power switch circuit to form an electrical connection or an open circuit between the first pin and the second pin according to the signal from the third pin;
a first power obtaining circuit coupled to the first pin and configured to obtain a first voltage from the first pin to generate a second voltage;
a regulator coupled to the first power obtaining circuit and the driver and configured to convert the second voltage into a third voltage and provide the third voltage for the driver;
a second power obtaining circuit coupled to the third pin and the regulator and configured to obtain a fourth voltage from the third pin to generate a fifth voltage, wherein the regulator is configured to convert the fifth voltage into the third voltage; and
a third power obtaining circuit coupled to the power switch circuit and the regulator and configured to obtain a sixth voltage from the power switch circuit to generate a seventh voltage, wherein the regulator is configured to convert the seventh voltage into the third voltage.

2. The power device according to claim 1, wherein the first power obtaining circuit comprises a junction gate field-effect transistor (JFET) with an input, an output, and a control terminal, the input is coupled to the first pin, the output is coupled to the regulator, and the control terminal is coupled to the second pin or a predetermined voltage source.

3. The power device according to claim 1, wherein the second power obtaining circuit comprises a diode with an anode and a cathode, the anode is coupled to the third pin, and the cathode is coupled to the regulator.

4. The power device according to claim 3, wherein the diode is composed of a transistor.

5. The power device according to claim 1, wherein power switch circuit comprises:
a first switching element having a first input, a first output, and a first control terminal, wherein the first input is coupled to the first pin, the first output is coupled to the third power obtaining circuit, and the first control terminal is coupled to the second pin; and a second switching element having a second input, a second output, and a second control terminal, wherein the second input is coupled to the first output, the second output is coupled to the second pin, and the second control terminal is coupled to the driver;

wherein the third power obtaining circuit is configured to obtain the sixth voltage from the first output.

6. The power device according to claim 5, wherein the first switching element comprises a depletion-mode GaN transistor and the second switching element comprises a metal-oxide-semiconductor effect field transistor or an enhancement-mode GaN transistor.

7. The power device according to claim 5, wherein the third power obtaining circuit comprises a diode with an anode and a cathode, the anode is coupled to the first output, and the cathode is coupled to the regulator.

8. The power device according to claim 7, wherein the diode is composed of a transistor.

9. A power device comprising:

a first pin;

a second pin;

a third pin configured to receive a signal;

a power switch circuit coupled between the first pin and the second pin;

a driver coupled to the third pin and the power switch circuit and configured to control the power switch circuit to form an electrical connection or an open circuit between the first pin and the second pin according to the signal from the third pin;

a first power obtaining circuit coupled to the third pin and configured to obtain a first voltage from the third pin to generate a second voltage;

a regulator coupled to the first power obtaining circuit and the driver and configured to convert the second voltage into a third voltage and provide the third voltage for the driver; and a second power obtaining circuit coupled to the power switch circuit and the regulator and configured to obtain a fourth voltage from the power switch circuit to generate a fifth voltage, wherein the regulator is configured to convert the fifth voltage into the third voltage;

wherein the power switch circuit comprises:

a first switching element having a first input, a first output, and a first control terminal, wherein the first input is coupled to the first pin, the first output is coupled to the second power obtaining circuit, and the first control terminal is coupled to the second pin; and a second switching element having a second input, a second output, and a second control terminal, wherein the second input is coupled to the first output, the second output is coupled to the second pin, and the second control terminal is coupled to the driver;

wherein the second power obtaining circuit is configured to obtain the fourth voltage from the first output.

10. The power device according to claim 9, wherein the first power obtaining circuit comprises a diode with an anode and a cathode, the anode is coupled to the third pin, and the cathode is coupled to the regulator.

11. The power device according to claim 10, wherein the diode is composed of a transistor.

12. The power device according to claim 9, wherein the first switching element comprises a depletion-mode GaN transistor and the second switching element comprises a metal-oxide-semiconductor effect field transistor or an enhancement-mode GaN transistor.

13. A power device comprising:

a first pin;

a second pin;

a third pin configured to receive a signal;

a power switch circuit coupled between the first pin and the second pin and configured to connect the first pin to the second pin or disconnect the first pin from the second pin;

a driver coupled to the third pin and the power switch circuit and configured to control the power switch circuit to form an electrical connection or an open circuit between the first pin and the second pin according to the signal from the third pin;

a first power obtaining circuit coupled to the power switch circuit and configured to obtain a first voltage from the power switch circuit to generate a second voltage; and a regulator coupled to the first power obtaining circuit and the driver and configured to convert the second voltage into a third voltage and provide the third voltage for the driver;

wherein the power switch circuit comprises:

a first switching element having a first input, a first output, and a first control terminal, wherein the first input is coupled to the first pin, the first output is coupled to the first power obtaining circuit, and the first control terminal is coupled to the second pin; and a second switching element having a second input, a second output, and a second control terminal, wherein the second input is coupled to the first output, the second output is coupled to the second pin, and the second control terminal is coupled to the driver;

wherein the first power obtaining circuit is configured to obtain the first voltage from the first output.

14. The power device according to claim 13, wherein the first switching element comprises a depletion-mode GaN transistor and the second switching element comprises a metal-oxide-semiconductor effect field transistor or an enhancement-mode GaN transistor.

15. The power device according to claim 13, further comprising a second power obtaining circuit coupled to the first pin and the regulator and configured to obtain a fourth voltage from the first pin to generate a fifth voltage, wherein the regulator is configured to convert the fifth voltage into the third voltage.

* * * * *